US008669128B2

(12) United States Patent
Gwo et al.

(10) Patent No.: US 8,669,128 B2
(45) Date of Patent: Mar. 11, 2014

(54) METHOD OF PRODUCING III-NITRIDE LIGHT-EMITTING DIODE

(75) Inventors: Shang-Jr Gwo, Hsinchu (TW); Hon-Way Lin, Hsinchu (TW); Yu-Jung Lu, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 13/335,199

(22) Filed: Dec. 22, 2011

(65) Prior Publication Data

US 2012/0097920 A1 Apr. 26, 2012

Related U.S. Application Data

(63) Continuation-in-part of application No. 12/846,443, filed on Jul. 29, 2010, now Pat. No. 8,242,523.

(51) Int. Cl.
*H01L 21/00* (2006.01)
(52) U.S. Cl.
USPC .......................................................... 438/35
(58) Field of Classification Search
USPC .......... 257/13, 22, 34, 35, E33.025, E33.008; 977/950; 438/22, 34, 35
See application file for complete search history.

(56) References Cited

U.S. PATENT DOCUMENTS 7,030,414 B2 * 4/2006 Asami et al. .................... 257/79
2005/0082543 A1 * 4/2005 Alizadeh et al. ................ 257/79

OTHER PUBLICATIONS

Lin et al., "InGaN/GaN nanorod array white light-emitting diode", 2010, Applied Physics Letters, vol. 97, pp. 073101-1-073101-3, published on Aug. 16, 2010.*
Yang et al., "Fabricated nano-disk InGaN/GaN multi-quantum well of the inverse hexagonal pyramids", 2008, Journal of Physics and Chemistry of Solids, vol. 69, pp. 589-592, Feb.-Mar. 2008.*
Kishino et al., "InGaN/GaN Nanocolumn LEDs Emitting from Blue to Red", 2007, Proc. of SPIE, vol. 6473, 6473OT (pp. 1-12), Jan. 2007.*
Keller et al., "Growth and characterization of bulk InGaN films and quantum wells", 1996, Appl. Phys. Lett., vol. 88 No. 22, pp. 3147-3149, May 1996.*
Lu et al., "Single InGaN nanodisk light emitting diodes as full-color subwavelength light sources", 2011, Applied Physics Letters, vol. 98, 233101, pp. 1-3, Jun. 6, 2011.*
Chen et al., "Structure and photoluminescence properties of epitaxially oriented GaN rods grown on Si(111) by plasma-assisted molecular-beam epitaxy", 2006, Applied Physics Letters, vol. 89, 243105, pp. 1-3, Dec. 2006.*
Schubert, E. F. & Kim, J. K., "Sold-state light sources getting smart," *Science*, May 27, 2005, pp. 1274-1278, vol. 308.
Krames, M. R., Shchekin, O. B., Mueller-Mach, R., Mueller, G. O., Zhou, L., Harbers, G. & Craford, M. G., "Status and future of high-power light-emitting diodes for solid-state lighting," *J. Disp. Technol.*, Jun. 2007, pp. 160-175, vol. 3—No. 2.

(Continued)

*Primary Examiner* — Nikolay Yushin
(74) *Attorney, Agent, or Firm* — Muncy, Geissler, Olds & Lowe, P.C.

(57) ABSTRACT

This invention relates to structures and fabricating methods of light-emitting diodes capable of emitting white or a color within full-visible-spectrum with better efficiency and flexibility. An embodiment provides a light-emitting diode array consisted of one or more light-emitting diodes on a substrate. Each light-emitting diode comprises a first doped nanorod, an active light-emitting region consisted of one or more nanodisks on the first doped nanorod, and a second doped nanorod on the active light-emitting region. Another embodiment provides a fabricating method of the light-emitting diode array.

18 Claims, 12 Drawing Sheets

(56) References Cited

OTHER PUBLICATIONS

Mukai, T., Yamada, M. & Nakamura, S., "Characteristics of InGaN-based uv/blue/green/amber/red light-emitting diodes," *Jpn. J. Appl. Phys.*, Jul. 1999, pp. 3976-3981, vol. 38.

Xu, T., Nikiforov, A. Yu., France, R., Thomidis, C., Williams, A. & Moustakas, T. D., "Blue—green—red LEDs based on InGaN quantum dots grown by plasma-assisted molecular beam epitaxy." Phys. Stat. Sol. A, 2007, pp. 2098-2102, vol. 204.

Humphreys, C. J., "Solid-state lighting," *MRS Bull.*, Apr. 2008, pp. 459-470, vol. 33.

Fiorentini, V., Bernardini, F., Della Sala, F., Di Carlo, A. & Lugli, P., "Effects of macroscopic polarization in III-V nitride multiple quantum wells," *Phy. Rev. B*, Sep. 15, 1999, pp. 8849-8858, vol. 60—No. 12.

Waltereit, P., Brandt, O., Trampert, A., Grahn, H. T., Menniger, J., Ramsteiner, M., Reiche, M. & Ploog, K. H., "Nitride semiconductors free of electrostatic fields for efficient white light-emitting diodes," *Nature*, Aug. 24, 2000, pp. 865-868, vol. 406.

Masui, H., Nakamura, S., DenBaars, S. P. & Mishra, U. K., "Nonpolar and semipolar III-nitride light-emitting diodes: Achievements and challenges," *IEEE Trans. Electron Devices*, Jan. 2010, pp. 88-100, vol. 57—No. 1.

Chen, H.-Y., Lin, H.-W., Shen, C.-H. & Gwo, S., "Structure and photoluminescence properties of epitaxially oriented GaN nanorods grown on Si(111) by plasma-assisted molecular-beam epitaxy." *Appl. Phys. Lett.*, 2006, pp. 243105-1-243105-3, vol. 89.

Gotoh, et al., "Piezoelectric effects on photoluminescence properties in 10-nm-thick InGaN quantum wells", Appl Phys. Lett., 2003, pp. 4791-4793, vol. 83.

\* cited by examiner

METHOD OF PRODUCING III-NITRIDE LIGHT-EMITTING DIODE

CROSS REFERENCE TO RELATED APPLICATIONS

This application is a continuation-in-part of application Ser. No. 12/846,443, filed Jul. 29, 2010 now U.S. Pat. No. 8,242,523 and entitled "III-nitride light-emitting diode and method of producing the same," the entire contents of which are incorporated herein by reference.

BACKGROUND OF THE INVENTION

1. Field of the Invention

The present invention relates to III-nitride light-emitting diode and their forming methods.

2. Description of the Prior Art

Solid-state light sources based on white light emitting diode (LED) technology have gained much attention because of their tremendous potential for energy-efficient general illumination applications. In white LEDs, the luminous efficacy and color rendering can be controlled by light mixing of polychromatic (e.g., red, yellow, green, blue) emitters. At present, the indium gallium nitride (InGaN) compound semiconductor alloys are considered as the most promising material system for white LEDs since the direct band gaps of $In_xGa_{1-x}N$ ($0 \leq x \leq 1$) can be continuously tuned from the near-infrared (0.6 eV, InN) to near-UV (3.4 eV, GaN) region, including the entire visible spectrum. However, this potential is limited by the dramatic drop in the InGaN emission efficiency at longer wavelengths. To date, efficient InGaN LEDs are only available in the blue region. Thus, monolithic white LEDs are typically realized by the luminescence down-conversion technique using yellow phosphors, such as cerium-doped yttrium aluminum garnet. The efficiency and light quality of phosphor-converted devices, however, are still imperfect due to the Stokes shift loss and limited color rendering. Furthermore, optimized color displays would require full-visible-spectrum emitters. Thus, a major current research focus is to improve the InGaN emission efficiency at longer wavelengths. Especially, the spectral range between 550 and 590 nm is the well known "green-yellow gap," where the highest spectral response region of the human eye resides in and none of the existing semiconductors can be used to make high-efficiency LEDs.

The origin of the wavelength-dependent emission efficiency can be attributed mainly to the large lattice mismatch between InN and GaN (~11%) and the polar nature of their crystal structure. High-quality InGaN LEDs based on conventional planar InGaN/GaN multiple quantum well structures are currently grown along the polar c-axis of the wurtzite crystal structure. Therefore, growth of high-In-content InGaN/GaN quantum wells would unavoidably result in a high density of defects and huge internal electrostatic (piezoelectric) fields (>1 MV/cm). The internal fields in the InGaN wells spatially separate the electron and hole wave functions, i.e., quantum confined Stark effect (QCSE), making highly efficient longer-wavelength LEDs difficult to achieve based on polar c-plane structures. For the blue (low-In-content) InGaN LEDs, the carrier localization phenomenon and ultrathin quantum well structures (about 2-4 nm in width for nearly all commercial InGaN LEDs or laser diodes) could alleviate the effects of high defect density and QCSE. Unfortunately, these are not applicable in the case of high-In-content InGaN quantum wells because of the lack of strong charge localization and increasingly large internal electrostatic fields. Besides, there are other QCSE- and ultrathin-well-related detrimental features of c-plane InGaN LEDs, including efficiency droop and blue-shift of the emission wavelength (due to carrier screening of internal electrostatic fields) with increasing drive current. Therefore, avoiding QCSE in InGaN LEDs has been considered as an important milestone to realize the ultimate solid-state light sources for general illumination.

In the past few years, tremendous efforts have been made to solve the QCSE obstacle by using the nonpolar (e.g., a- or m-plane) InGaN/GaN structures grown on various substrates. However, the nonpolar approach has its own limitations and challenges such that ideal solutions for the green-yellow-gap and efficiency droop issues are still lacking.

SUMMARY OF THE INVENTION

An object of the present invention is to provide light-emitting diode s having better performance and properties than prior art. In addition, the green-yellow-gap and efficiency droop issue can be overcome. Moreover, a simple, economical, efficient method to produce such light-emitting diodes is also needed.

An embodiment of this invention provides a light-emitting diode (LED) capable of emitting white light without using phosphor, the LED comprising: a substrate; a first electrode arranged below the substrate; a n-type gallium nitride (GaN) nanorod array consisted of n-type GaN nanorods arranged on the substrate and ohmic contacting with the first electrode; one or more indium gallium nitride (InGaN) nanodisks disposed on each of the n-type GaN nanorods; a p-type GaN nanorod array consisted of p-type GaN nanorods, wherein one p-type GaN nanorod is corresponded to one n-type GaN nanorod and is disposed on top of the one ore more InGaN nanodisks of the corresponded n-type GaN nanorod; a second electrode ohmic contacting with the p-type GaN nanorod array.

Another embodiment of this invention provides a method for producing a light-emitting diode, the method comprising the steps of: providing a conducting substrate; forming a first electrode below the conducting substrate; forming a n-type gallium nitride (GaN) nanorod array consisted of one or more n-type GaN nanorods that arranged on the substrate and ohmic contacts with the first electrode; forming one or more indium gallium nitride (InGaN) nanodisks on each of the n-type GaN nanorod; forming a p-type GaN nanorod array consisted of one or more p-type GaN nanorods, wherein one p-type GaN nanorod is corresponded to one n-type GaN nanorod and is formed on top of the one ore more InGaN nanodisks of the corresponded n-type GaN nanorod; and forming a second electrode that ohmic contacts with the p-type GaN nanorod array; wherein the light-emitting diode is capable of emitting white light by controlling the thickness and number of the one or more InGaN nanodisks.

BRIEF DESCRIPTION OF THE DRAWINGS

FIG. 1c is a micro-EL image (20 mA) under a 100× objective revealing full-visible-spectrum emissions from the white LED shown in FIG. 1a.

DESCRIPTION OF THE PREFERRED EMBODIMENT

Reference will now be made in detail to specific embodiments of the invention. Examples of these embodiments are illustrated in accompanying drawings. While the invention will be described in conjunction with these specific embodiments, it will be understood that it is not intended to limit the invention to these embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well-known process operations and components are not been described in detail in order not to unnecessarily obscure the present invention. While drawings are illustrated in details, it is appreciated that the quantity of the disclosed components may be greater or less than that disclosed, except expressly restricting the amount of the components. Wherever possible, the same or similar reference numbers are used in drawings and the description to refer to the same or like parts.

The primary object of the present invention can be achieved by using self-assembled GaN nanorod arrays on Si substrates as templates for growing strain-free InGaN/GaN nanorod heterostructures. The most salient feature of the nanorod-based approach is the absence of piezoelectric polarization effects, allowing thick (tens of nm) InGaN nanodisk emitter structures in the full visible range. By using this approach, the present invention demonstrates both monolithic, phosphor-free white (polychromatic) nanorod-array LEDs and polarized full-color (monochromatic) single-nanorod LEDs.

A phosphor-free white, polychromatic nanorod-array LEDs according to a preferred embodiment is described below. Vertically self-aligned GaN nanorod arrays were grown along the wurtzite c-axis on 3-inch, n-type Si(111) substrates by plasma-assisted molecular-beam epitaxy (PAMBE) [Chen, H.-Y., Lin, H.-W., Shen, C.-H. & Gwo, S. Structure and photoluminescence properties of epitaxially oriented GaN nanorods grown on Si(111) by plasma-assisted molecular-beam epitaxy. Appl. Phys. Lett. 89, 243105 (2006)]. The PAMBE-grown GaN nanorod arrays exhibit the properties of strain- and dislocation-free single crystals, which can be used as nanostructured compliant templates for growing strain-free InGaN nanodisks.

Figure 1A:
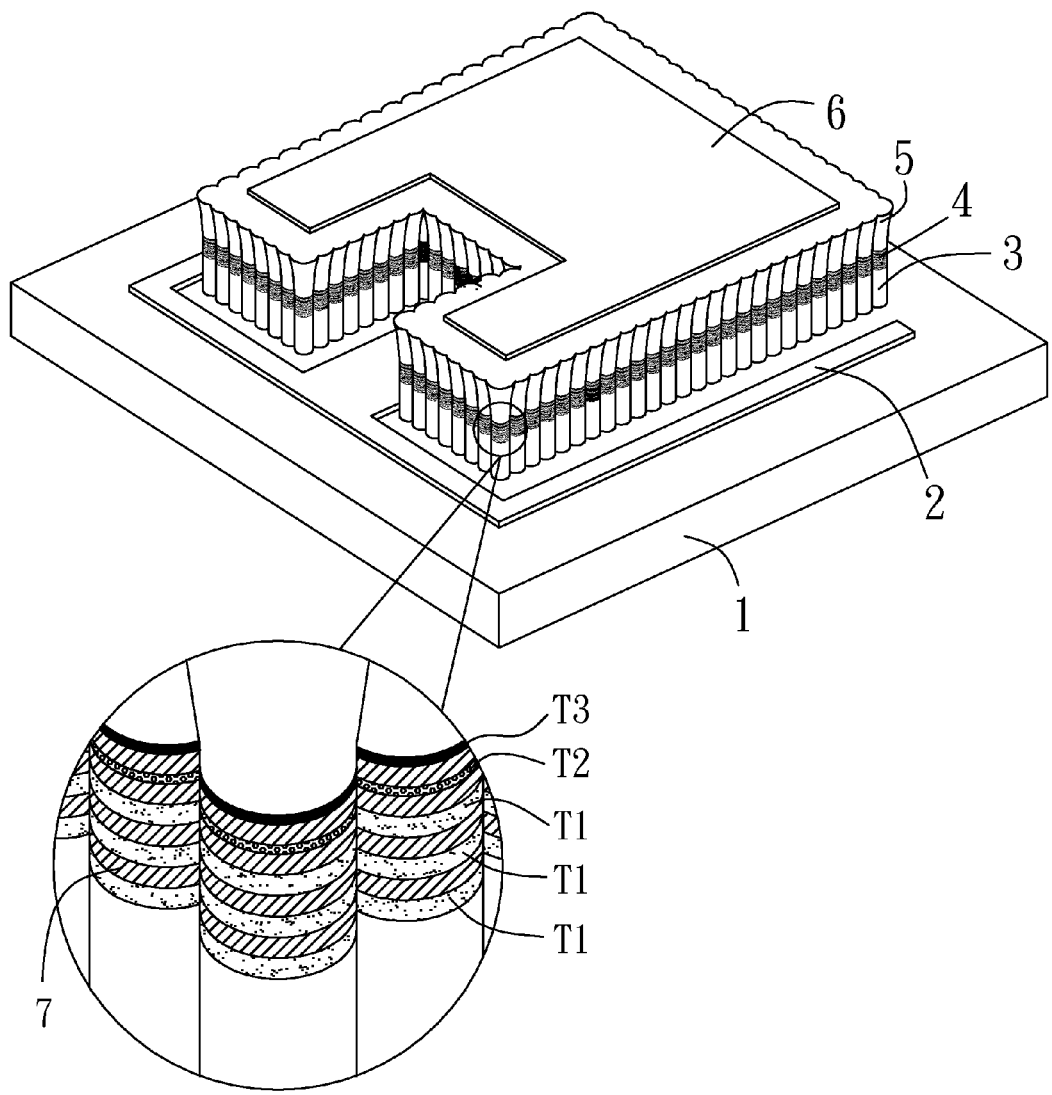
FIG. 1a is a schematic diagram of LED structure for generating white light according to an embodiment of the present invention.
Figure 1B:
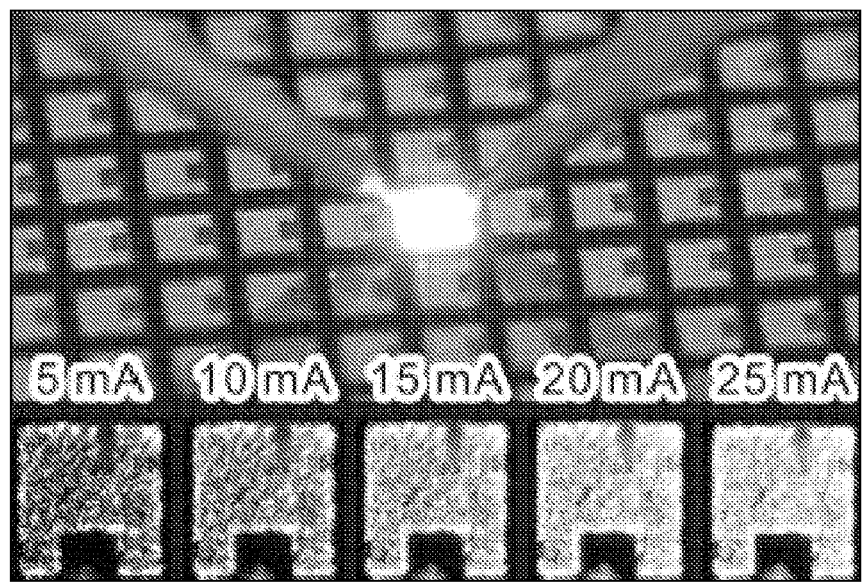
FIG. 1b is a photograph of LED of FIG. 1a, which emits white light with 20 mA injection current, and micro-electroluminescence (EL) images shown below are acquired under a 10× objective at various injection currents.
Figure 1C:
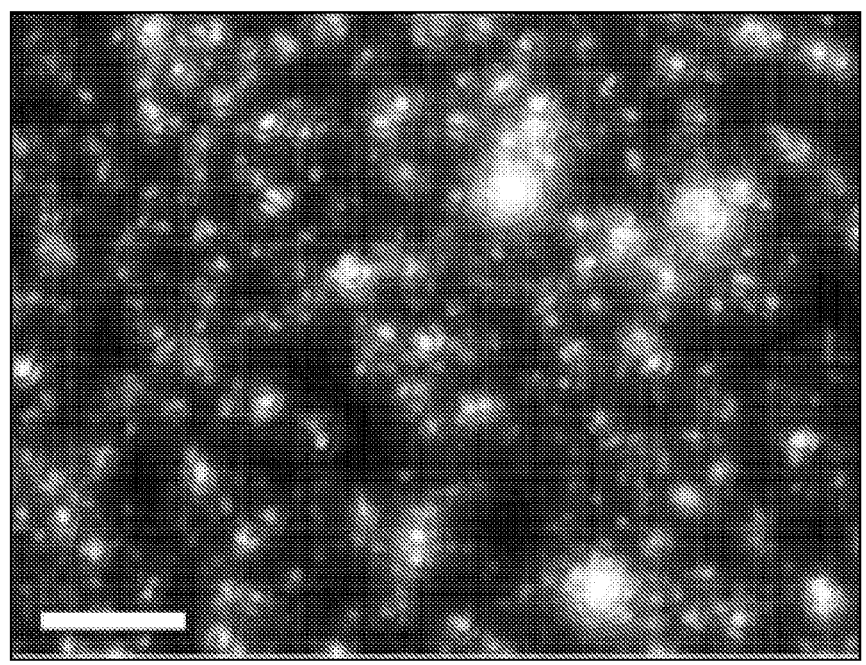
Figure 1D:
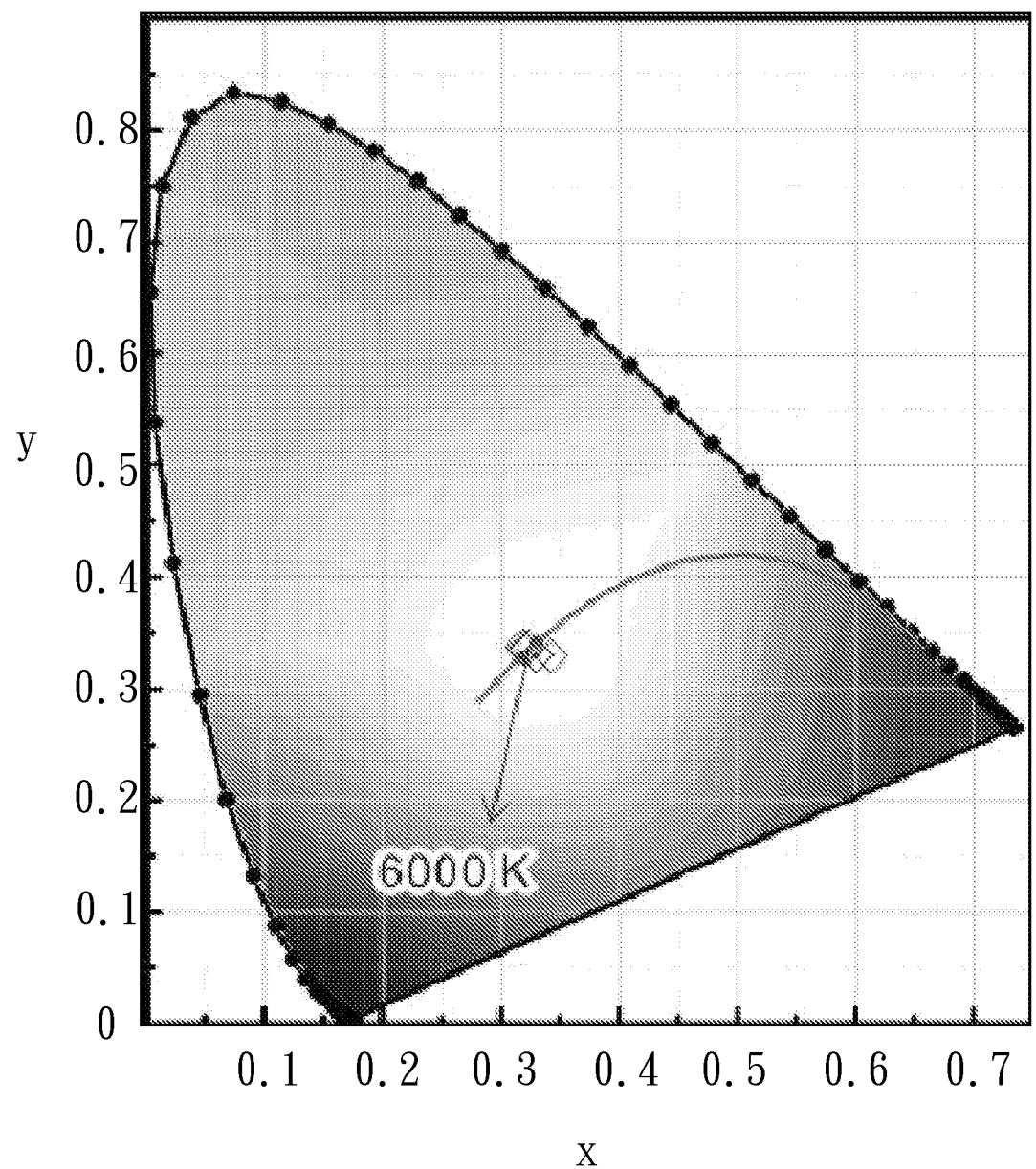
FIG. 1d is Commission internationale de l'éclairage (CIE) 1931 chromaticity coordinates of LED of FIG. 1a with injection currents from 5 mA to 25 mA.

FIGS. 1a to 1d show a light-emitting diode according to a preferred embodiment of the present invention, where FIG. 1a is a schematic diagram of nanorod-array LED structure for generating white light; FIG. 1b is a photograph of nanorod-array LED emitting white light at 20 mA injection current, and micro-electroluminescence (EL) images shown below are acquired under a 10× objective at various injection currents; FIG. 1c is a micro-EL image (20 mA) under a 100× objective revealing full-visible-spectrum emissions from the white LED shown in the photograph with scale bar: 10 μm, and FIG. 1d is Commission internationale de l'éclairage (CIE) 1931 chromaticity coordinates at injection currents from 5 mA to 25 mA in which the correlated color temperature (shown on the Planckian locus) maintains at near 6000 K (natural white light) for injection currents larger than 5 mA.

As shown in FIG. 1a, the light-emitting diode of the embodiment primarily includes a n-type silicon substrate 1, a Ti/Au electrode 2 disposed on the silicon substrate 1, a n-type gallium nitride (GaN) nanorod array 3 consisted of n-type GaN nanorods ohmic contacting with the Ti/Au electrode 2, one or more indium gallium nitride (InGaN) nanodisks 4 disposed on each of the n-type GaN nanorod 3, a p-type GaN nanorod array 5 consisted of p-type GaN nanorods disposed on top of the InGaN nanodisks 4 where one p-type GaN nanorod corresponds to one n-type GaN nanorod, and a Ni/Au electrode 6 ohmic contacting with the p-type GaN nanorod array 5. Notice that the Ti/Au electrode 2 may not directly contact but form an ohmic contact to the n-type GaN array 3 via the silicon substrate 1. In addition, Ni/Au electrode 6 is transparent, and each of the p-type GaN nanorods 5 has two ends in which the end near the transparent electrode 6 may be wider than the other end. This structure is helpful to prevent formation of leakage current channels.

The white-light emission is realized by a stack of nanodisks 4 embedded in the GaN nanorod p-n junction 3/5 for the desired light mixing effects. It is important to know that each array of InGaN nanodisk contains a continuous distribution of emitters at different wavelengths, while the average emission wavelength can be controlled by growth temperature T and In/Ga beam fluxes. In this embodiment, the light-emitting diode contains three T1 InGaN nanodisks, one T2 InGaN nanodisk, and one T3 InGaN nanodisk, and the growth temperatures for T1, T2, and T3 are $T_1 > T_2 > T_3$. Notice that in other embodiments of the present invention, the number of the InGaN nanodisks including T1, T2, and T3 is not limited. In addition, a GaN barrier layer 7 is interposed between each two of the InGaN nanodisks 4. For conventional planar InGaN/GaN multiple quantum well structures, the InGaN active layer thickness has been limited to about 2-4 nm. Here, the embodiment takes full advantage of the strain-free nanodisk structure to stack nanodisks with varying thicknesses (for example, each InGaN nanodisk has a thickness about 10-25 nm). Furthermore, the number and position (with respect to the p-GaN region) of nanodisks are very important to obtain the appropriate light mixing conditions for natural white emission (FIG. 1b). The thick InGaN nanodisks employed here provide larger and tunable active region volumes as well as improved carrier capture with reduced electron overflow at high currents. As will be shown later, the thick nanodisks can also lead to a solution to efficiency droop phenomenon. Additionally, the full-color emissions shown in FIG. 1c demonstrate a unique opportunity to fabricate nanorod-array LEDs with high color rendering capability. For the phosphor-based white LEDs, high color rendering would require a wide array of novel full-color phosphors, which will be a daunting task because of the required temperature stability, quantum efficiencies, and chemical robustness.

Figure 2A:
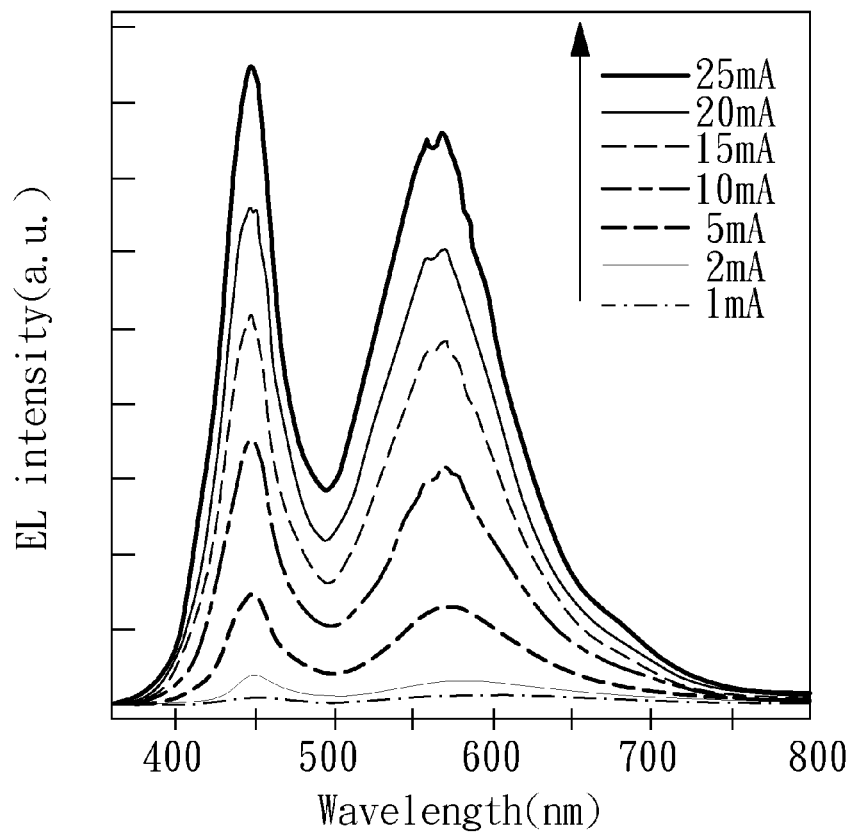
FIG. 2a is an electroluminescence (EL) spectra of InGaN/GaN nanorod-array white LED at injection currents from 1 mA to 25 mA according to the embodiment of the present invention.

FIG. 2a is an electroluminescence (EL) spectra of InGaN/GaN nanorod-array white LED at injection currents from 1 mA to 25 mA according to the preferred embodiment of the present invention. Two major peaks can be clearly identified at 448 nm (blue-band) and 569 nm (yellow-band) at 20 mA. The spectral blue shift with increasing current is negligibly small from 5 mA to 25 mA. This behavior illustrates that the QCSE is insignificant in InGaN nanodisk emitters. While full-color emissions are observed in the micro-EL image (FIG. 1c), two major peaks resulting from $T_1$ (blue-band) and $T_2$ (yellow-band) nanodisk arrays can be clearly identified, note that the contribution from the $T_3$ nanodisk array (extending into the red region) is weaker and mixed within the yellow-band. Both blue and yellow emission bands show negligibly small spectral blue shifts with increasingly current by 5-25 mA. From these EL spectra, it can be understood that the light mixing of blue- and yellow-band causes the white light emission shown in FIG. 1b. The small spectral blue-shifts with increasing current indicate insignificant polarization effects in the InGaN nanodisk emitters, which in turn results in the drive-current-insensitive correlated color temperatures measured for the nanorod-array white LED (FIG. 1d).

At present, the efficiency droop phenomenon of InGaN LEDs at high injection current densities is considered the major obstacle hindering high-brightness LEDs for general illumination applications. The embodiment of the present invention provides the thick and strain-free InGaN/GaN nanorod heterostructures that can overcome the efficiency droop phenomenon.

Figure 2B:
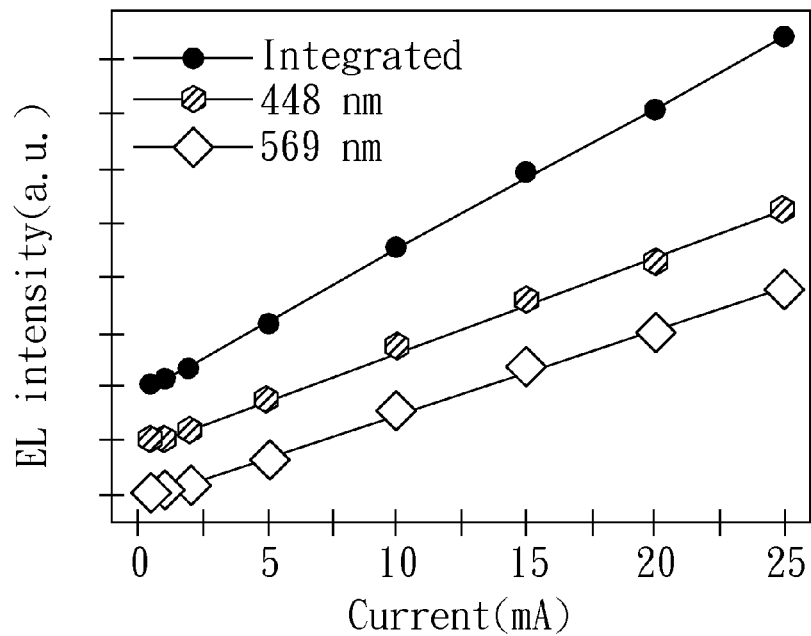
FIG. 2b shows plots of integrated and individual EL intensities at two major peaks shown in FIG. 2a as functions of injection current.

FIG. 2b shows plots of EL intensity of integrated LED and EL intensity at two specific wavelengths of two major peaks in FIG. 2a as functions of injection current. Both the blue- and yellow-band intensities increase monotonically with increasing injection current at a constant slope, resulting in drive-current-insensitive white light emission. In addition, the integrated EL shows no sign of intensity degradation.

Although the injection current was tested only up to 25 mA (~53 A/cm$^2$ in current density), the actual current density passing through individual nanorod can be very high.

To measure the maximum current density before the onset of efficiency droop, another embodiment provides a single-nanorod LED and its electrical and optical characterization.

Figure 3A:
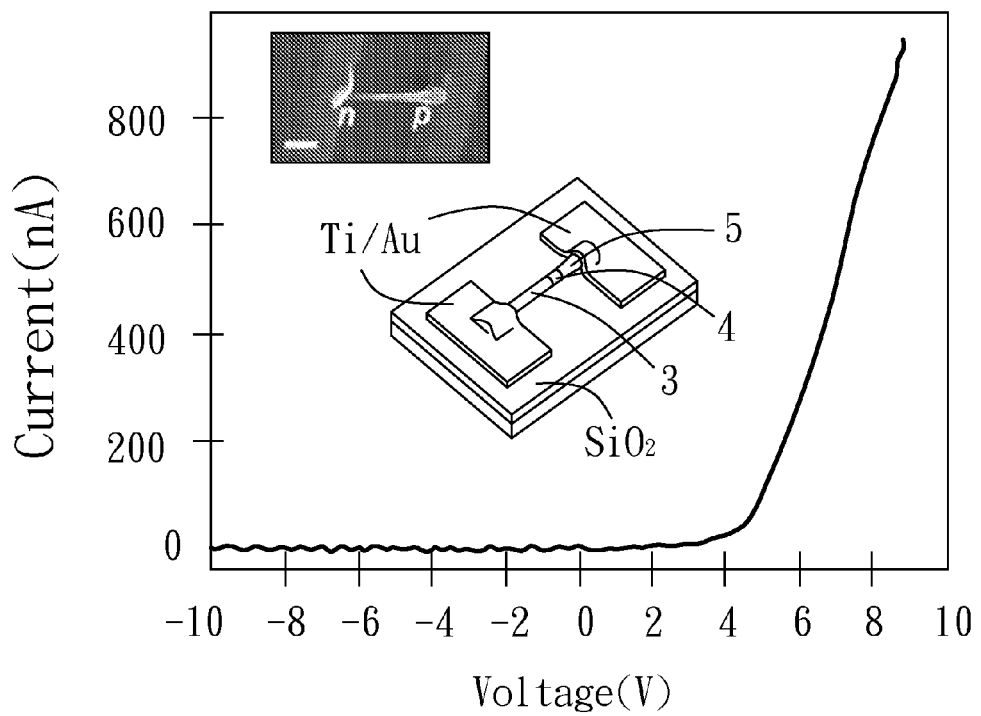
FIG. 3a is I-V curve of a single InGaN/GaN nanorod LED at room temperature according to an embodiment of the present invention.

FIG. 3a is I-V curve of a single InGaN/GaN nanorod LED at room temperature according to an embodiment of the present invention. No leakage current can be found at −10 V. Inset shows the field-emission scanning electron microscopy (FE-SEM) image and schematic diagram of the measured nanorod structure in which the rod length is about 2 μm. The single-nanorod LED includes only one InGaN nanodisk 4 with 90 nm in diameter and 40 nm in thickness. Scale bar indicates 500 nm. The measured I-V characteristics show a good diode behavior. Especially, single-nanorod diode show no signs of leakage currents, which allows for the measurement of actual current density passing through a single InGaN/GaN nanorod.

Figure 3B:
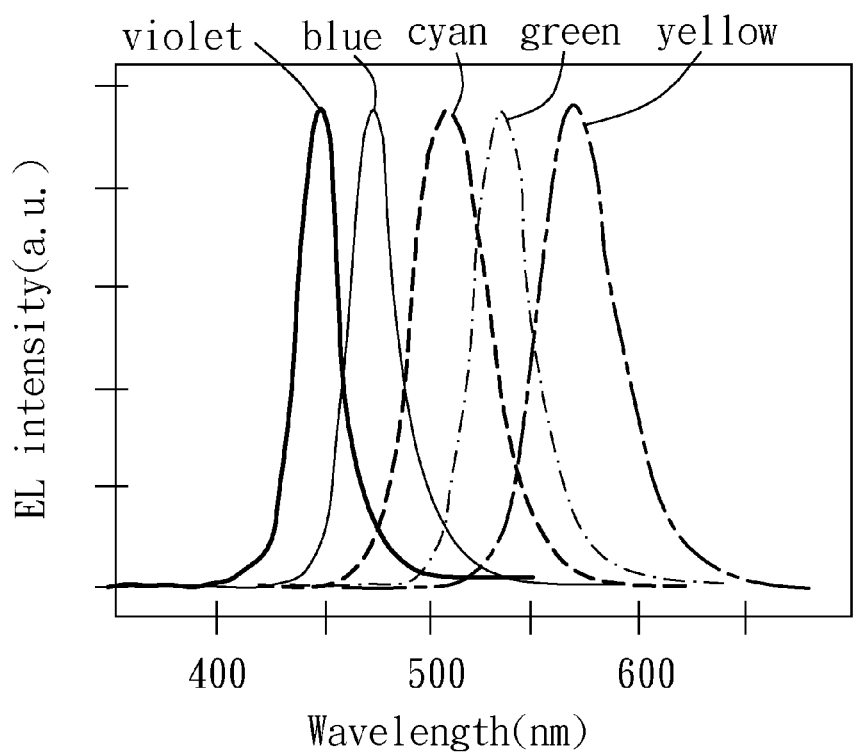
FIG. 3b shows normalized EL spectra of some single InGaN/GaN nanorod LEDs provided by embodiments of the present invention in which each single InGaN/GaN nanorod LED contains a single InGaN nanodisk.

FIG. 3b show normalized EL spectra of some single InGaN/GaN nanorod LEDS provided by embodiments of the present invention in which each single InGaN/GaN nanorod LED contains single InGaN nanodisk. The spectra show that the emissions from single InGaN nanodisks are monochromatic with narrow spectral widths (~25 nm). The corresponding optical microscopy images (not shown) of the diffraction-limited light emissions from single InGaN/GaN nanorod LEDs under forward bias current by 500 nA show color of violet, blue, cyan, green, and yellow, respectively.

Figure 3C:
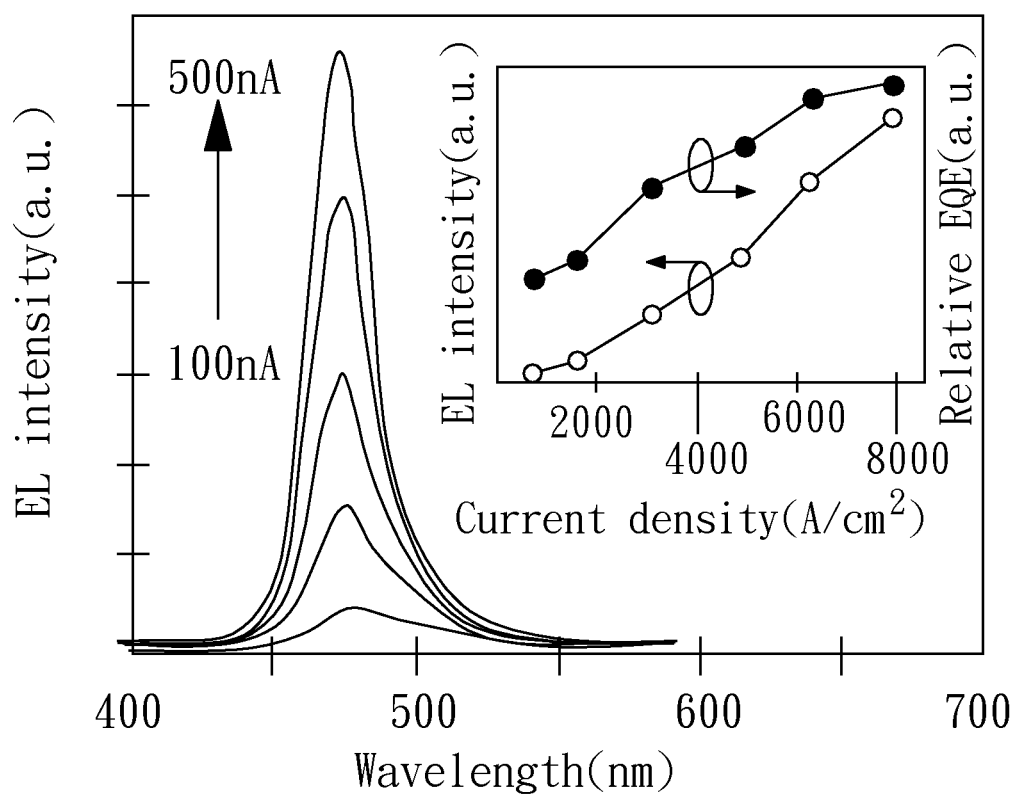
FIG. 3c shows EL spectra of the single InGaN/GaN nanorod LED shown in FIG. 3a emitting at 475 nm with increasing injection currents from 100 nA to 500 nA.

FIG. 3c shows EL spectra of a single InGaN/GaN nanorod LED emitting at 475 nm with injection currents from 100 nA to 500 nA. The single InGaN/GaN nanorod LED is the same diode measured in FIG. 3a. The acquired relations of EL intensity and relative external quantum efficiency (EQE) with respect to the injection current are shown in the inset. The relative EQE is estimated by EL intensity divided by the injection current and was measured by using a fixed emission collection geometry under DC injection mode. The relative EQE plot shows a trend of monotonic increase with increasing current density. In contrast, for conventional LEDs, this behavior holds only for current densities <10 A/cm$^2$. Using the known diameter (90 nm) of the nanorod, the maximum current density without showing efficiency degradation can be directly estimated to be 8,000 A/cm$^2$. This current density is extremely high in comparison with ~10 A/cm$^2$ for typical InGaN LEDs and ~200 A/cm$^2$ for an InGaN LED with a thick InGaN active layer. This high current density in single-nanorod LEDs without efficiency degradation is made possible by the thick (40 nm) and strain-free nanodisk structure employed in the present invention.

Figure 4A:
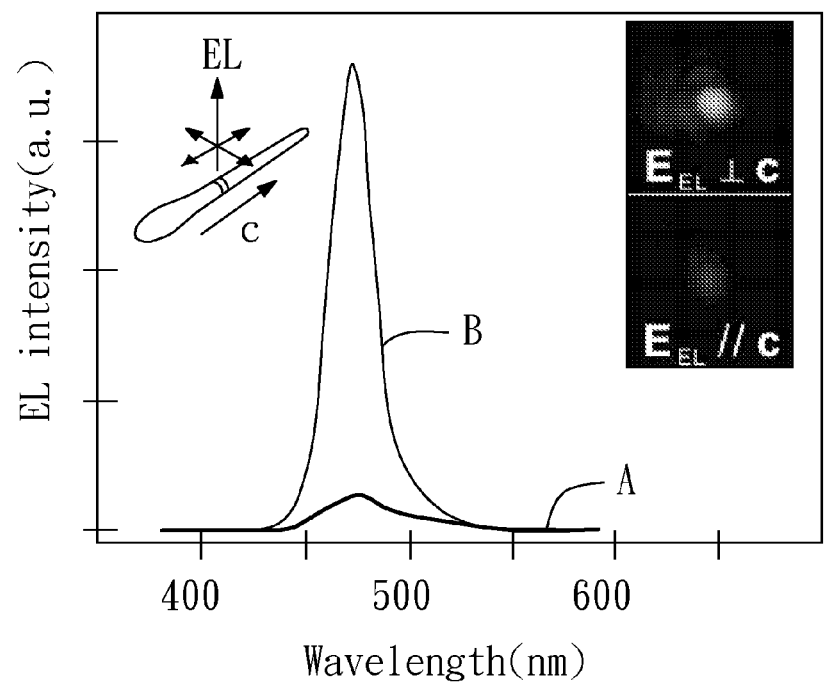
FIG. 4a shows polarized EL spectra of the single InGaN/GaN nanorod LED shown in FIG. 3a emitting at 475 nm. The injection current was set at 500 nA.

For some display applications, such as backlight displays, it is desirable to have polarized light emission from LEDs for improved system efficiencies. For nonpolar m-plane InGaN LEDs, there are already reports of large in-plane emission anisotropy, leading to possible backlighting applications in liquid crystal displays. In contrast, conventional polar c-plane InGaN LEDs exhibit no such properties. Here the present invention shows that the EL emission from polar nanorod heterostructures of the embodiments can be highly polarized. FIG. 4a show polarized EL spectra of a single InGaN/GaN nanorod LED (the same structure shown in FIG. 3a) at 500 nA injection current. These spectra were recorded with the emission polarization oriented parallel (curve A, $E_{EL}$//c) and perpendicular (curve B, $E_{EL} \perp$c) to the nanorod axis (the c-axis of the wurtzite crystal structure). The polarization ratio ρ is defined as $\rho=(I_{//}-I_\perp)/(I_{//}+I_{195})$, where $I_{//}$ and $I_\perp$ are the EL intensities corresponding to the electric fields of EL ($E_{EL}$) parallel and perpendicular to the c-axis (the nanorod axis), respectively. The measured polarization ratio is −0.85. The insets of FIG. 4a show the corresponding optical microscopy images under a 100× objective.

Figure 4B:
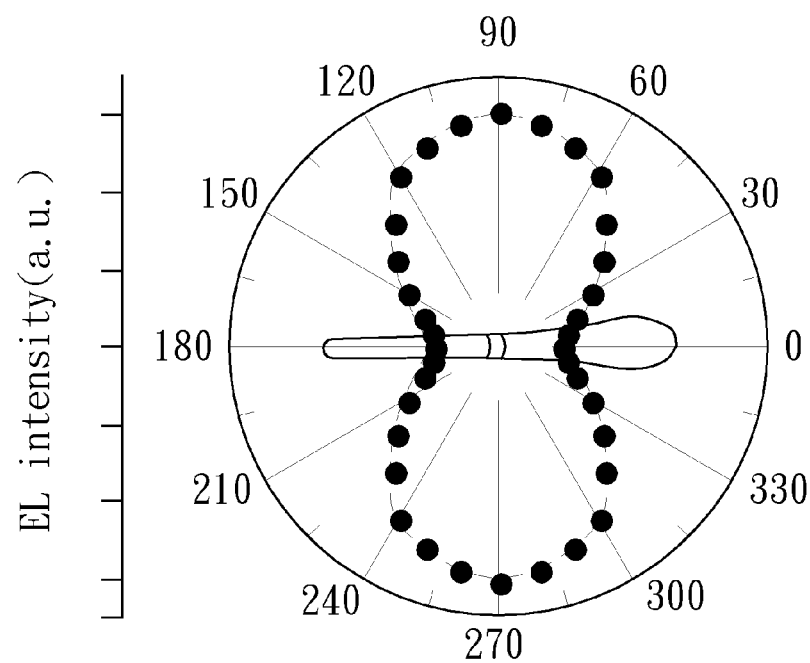
FIG. 4b shows the measured polar plot of integrated EL of the single InGaN/GaN nanorod LED shown in FIG. 3a emitting at 475 nm in which the linearly polarized EL intensity is plotted as a function of the emission polarization with respect to the nanorod long axis.

FIG. 4b shows the measured polar plot of linearly polarizaed EL intensity as a function of the emission polarization with respect to the nanorod long axis. A measured polarization ratio of −0.85 represents a high degree of EL polarization, as evidenced in FIG. 4b. Unlike most of the polarized emission from nanorod or nanowire luminescent materials, the observed EL anisotropy is oriented perpendicular to the nanorod axis (a negative ρ value). A previous study has identified that the optical confinement effect in single GaN nanorods (<100 nm in width) is the cause of polarized luminescence. In this mechanism, the polarization ratio is a function of emission wavelength and nanorod diameter. On the contrary, experiments of the present invention show that the polarized luminescence with negative ρ is from the InGaN nanodisk structure embedded in the GaN nanorod. Additionally, the measured negative values of ρ show weak dependences on the emission wavelength or diameter of the InGaN nanodisks. This behavior is very favorable for future applications requiring polarized light emission.

In summary, using both nanorod-array and single-nanorod LEDs, the present invention demonstrates that the LED structure based on thick and strain-free InGaN nanodisk emitters embedded in the self-assembled GaN nanorods can overcome the existing white LED technology limitations, such as the green-yellow gap and the efficiency degradation phenomenon under high-power operation. These devices do not require special nanofabrication techniques and have excellent scaling capability on Si substrates. In addition, the high flexibility in designing InGaN nanodisk emitter structures allows further device optimization for novel lighting and display applications.

Example of Producing White-Light InGaN/GaN Nanorod-Array LEDs

The InGaN/GaN nanorod array samples were grown on 3-inch, P-doped n-type Si(111) (resistivity: 0.001-0.005 Ωcm) wafers by nitrogen-plasma-assisted molecular beam epitaxy (PAMBE) under nitrogen-rich conditions, in comparison to the group-III/nitrogen flux ratio used for III-nitride film growth. The custom-made PAMBE system (DCA Instruments, DCA-600) is equipped with a large radio-frequency nitrogen plasma source (ADDON). The nitrogen plasma source during the growth procedure was at a nitrogen gas flow rate of 3 sccm (standard cubic centimeter per minute) under 500 W RF forward power. The in-situ reflection high energy electron diffraction (RHEED) observation confirms that the PAMBE-grown nanorods are wurtzite-type single crystals (the nanorod axial growth direction is along the wurtzite c-axis). The in-plane crystallographic axes of the nanorods are found to be the following epitaxial relation: $<2\bar{1}\bar{1}0>\|[\bar{1}10]_{Si}$; $<1\bar{1}00>\|[11\bar{2}]_{Si}$. Prior to the InGaN nanodisk growth, Si-doped n-type GaN nanorod array (~1 μm in height) was grown first on the Si(111) substrate at 770° C. (growth temperature) [Ga beam equivalent pressure ($BEP_{Ga}$): $9\times10^{-8}$ Torr]. Subsequently, InGaN nanodisks were grown on top of the n-type GaN nanorods. The emission wavelengths of InGaN nanodisks were controlled by the growth temperature (T) and group-III beam fluxes. In FIG. 1a, three nanodisk growth temperature are $T_1>T_2>T_3$ ($T_1$: 705° C., $T_2$: 700° C., $T_3$: 690° C.). In this structure, which was used for fabricating nanorod-array white LEDs, three $T_1$ nanodisks ($BEP_{Ga}$: $7.5\times10^{-8}$ Torr; $BEP_{In}$: $2.6\times10^{-8}$ Torr; thickness of InGaN/GaN: ~25 nm/25 nm), one $T_2$ nanodisk ($BEP_{Ga}$: $6.2\times10^{-8}$ Torr; $BEP_{In}$: $3.3\times10^{--8}$ Torr; thickness of InGaN/GaN: ~10 nm/25 nm), and one $T_3$ nanodisk ($BEP_{Ga}$: $5.7\times10^{-8}$ Torr; $BEP_{In}$: $3.7\times10^{-8}$ Torr; thickness of InGaN/GaN ~15 nm/25 nm) were used to generate the white light emission. The thickness of each InGaN nanodisk ranges from 10 to 25 nm and the GaN barrier thickness is fixed at 25 nm, as shown schematically in FIG. 1a. On top of the $T_3$ InGaN nanodisk, Mg-doped p-type GaN nanorods (~1 μm in height) were grown at 690° C. The Ga/N flux ratio was then gradually increased to induce lateral growth of p-type GaN nanorods, thereby forming a quasi-continuous p-type GaN top film.

White LED devices were fabricated first by dry etching technique (inductively coupled plasma, ICP) to form mesas of 260×280 μm² in size (effective current passing area: ~47, 100 μm²). For the purpose of LED isolation, the exposed GaN nanorod part was etched into the Si substrate using a $SiO_2$ etch mask. Contact metals were then evaporated in a $10^{-7}$ Torr vacuum. The ohmic contact to n-type Si(111) and p-type GaN layers are Ti/Au (60 nm/40 nm) and Ni/Au (15 nm/35 nm). The Ni/Au top contact was thin enough to be transparent for the emitted light.

Example of Producing Monochromatic InGaN/GaN Single-Nanorod LED

The InGaN/GaN single-nanorod LED structure used in the present invention was grown on a 3-inch, n-type Si(111) wafer by PAMBE. First, 1.2 μm, n-type GaN nanorods were grown at 770° C., and then 40-nm-thick InGaN nanodisks were grown on top of the n-type GaN nanorods_($BEP_{Ga}$:$3.5\times10^{-8}$ Torr; $BEP_{In}$: $2.6\times10^{-8}$ Torr) at 705° C. Finally, 800 nm, p-type GaN nanorods were grown on top of the InGaN nanodisks at 685° C.

After PAMBE growth, this sample was dipped in 1% hydrogen fluoride (HF) solution for 30 seconds to remove native oxide covered on the nanorods. Then the samples were suspended in isopropanol solution with sonic bath and later were dispersed onto an oxidized (~500-nm-oxide covered) silicon substrate. The electrodes were patterned by a standard photolithography and lift off process. Both of the ohmic contacts to n-type and p-type electrodes are Ti/Au (20 nm/35 nm). Contact metals were electron-beam evaporated in a vacuum chamber and the base pressure was in the $10^{-7}$ Torr range. After the contact evaporation process, the LED devices were thermal annealled at 600° C. for 20 seconds in a vacuum chamber with the base pressure in the $10^{-9}$ Torr range.

For a person skilled in the art, modifications, alternatives, equivalents, and variations may be made to the above-mentioned embodiments and should be within the scope of this invention. For example, although the LED structure shown in FIG. 1a is a horizontal type of LED structure for illustrative purpose, it can be other types, such as a vertical type. In addition, other substrates may be employed instead of the silicon substrate. In addition, contact electrodes may be made of other materials or composite materials and may have other configurations and positions. Further, the LED structure may be transferred to another substrate, such as a metal substrate, a plastic substrate, a printed circuit board, a transparent substrate, or other substrates for various purposes.

Furthermore, alternative methods known in the art may be used to replace with one or more steps of the above-mentioned fabricating method. Moreover, the substrate may be p-type doped and the position of p-type and n-type GaN nanorod array 3/5 may be interchanged. Moreover, the terms "GaN" and "InGaN" used in this specification may refer to "GaN-based" and "InGaN-based"; the elements of which may be slightly varied or modified. For instance, InGaN may be replaced by AlInGaN and GaN may be replaced by AlGaN, etc.

Figure 5A:
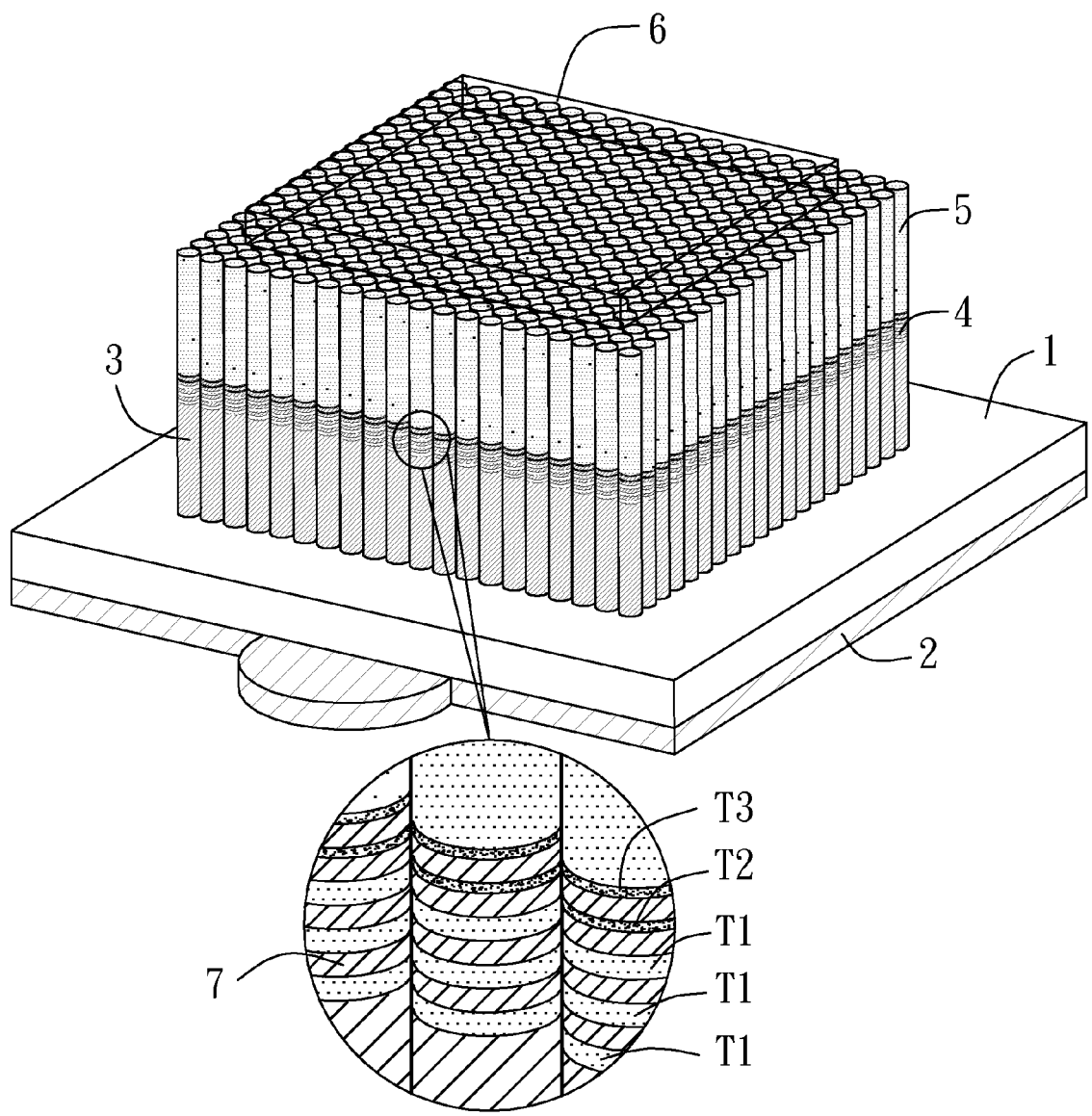
FIG. 5a and FIG. 5b are schematic diagrams of LED for generating white light according to two embodiments of the present invention.

FIG. 5a illustrates a vertical type of LED structure according to another embodiment of this invention. As shown in FIG. 5a, the light-emitting diode structure primarily includes a substrate 1, a first electrode 2, a first doped nanorod array 3, a plurality of active light-emitting regions 4, a second doped nanorod array 5, and a second electrode 6.

For illustrative purpose and preferably, the substrate 1 is an n-type doped silicon substrate; the first electrode 2 is a composite, multi-layered electrode, e.g., a Ti/Au electrode; the first doped nanorod array 3 is an n-type gallium nitride (GaN) nanorod array; each active light-emitting region includes one or more indium gallium nitride (InGaN) nanodisks; the second doped nanorod array 5 is a p-type gallium nitride (GaN) nanorod array; and the second electrode 6 is a transparent electrode, e.g., an indium tin oxide (ITO) electrode.

In this preferred embodiment, the first electrode 2 and the first doped nanorod array 3 are disposed on two opposite surfaces of the substrate 1. The first doped nanorod array 3 consists of n-type GaN nanorods ohmic contacting with the first electrode 2 through the substrate 1. The one or more indium gallium nitride (InGaN) nanodisks 4 are disposed on each of the n-type GaN nanorod 3. The p-type GaN nanorod array 5 consists of p-type GaN nanorods disposed on top of the InGaN nanodisks 4 where one p-type GaN nanorod corresponds to one n-type GaN nanorod. The second electrode 6, e.g., the ITO electrode 6 is disposed on and ohmic contacts with the p-type GaN nanorod array 5.

Figure 5B:
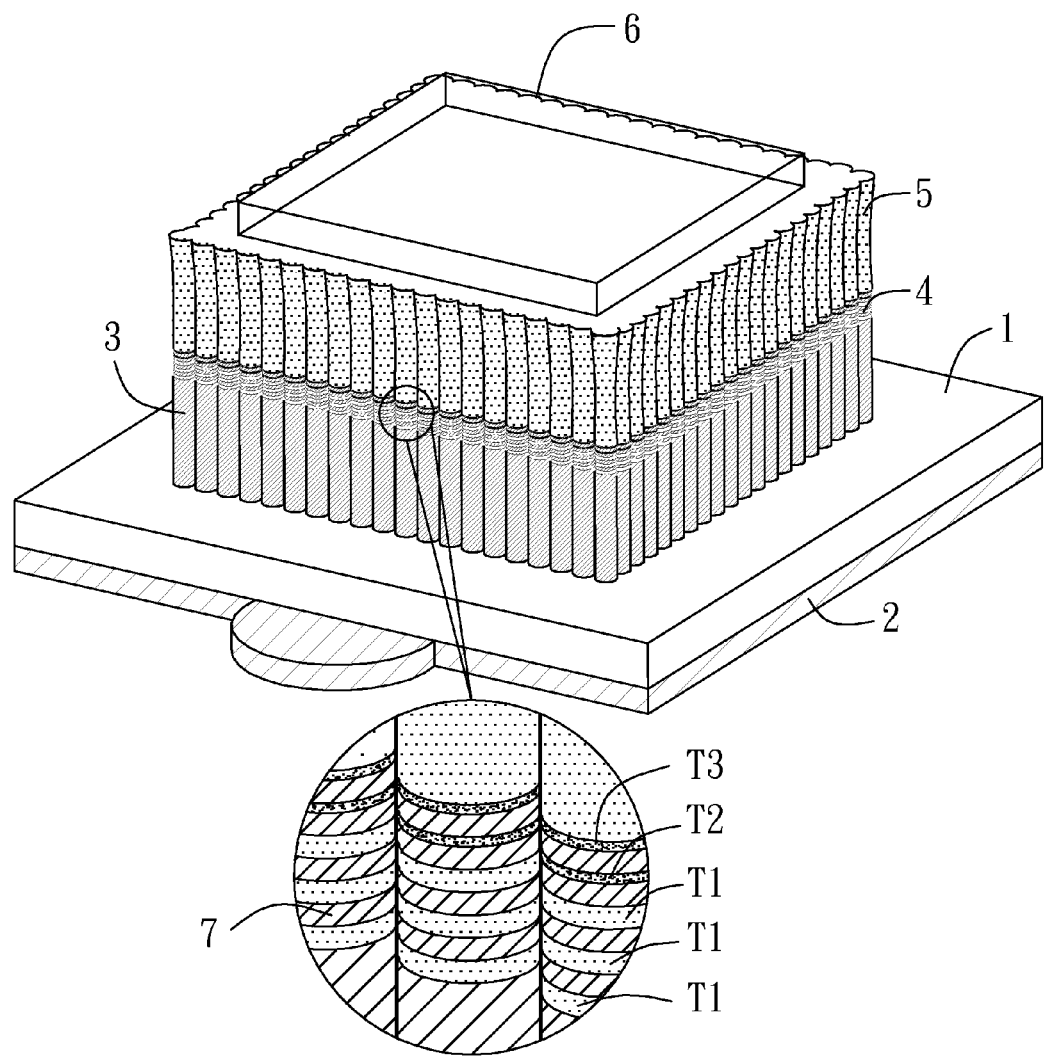

Preferably, the second electrode 6 is patterned and transparent or sufficient thin to be transparent. Further, each of the p-type GaN nanorods 5 and/or each of the n-type GaN nanorods 3 has two ends in which the end near to the transparent electrode 6, i.e., the first end from the transparent electrode 6, may be wider than the other, as shown in FIG. 5b. This structure is helpful to prevent formation of leakage current channels. The first electrode 1 may also be patterned so as to control the emitting area if necessary. Notice that the term "and/or" used in this specification refers to "and" or "or."

As mentioned before, the emitting wavelength, i.e., the emitting color or the desired mixing effect of the LED structure, can be controlled by the number and the emission wavelength of the nanodisk emitter(s), which is controlled by the growth temperature T and flux ratio of elements, e.g., In/Ga beam flux ratio in the epitaxial process for growing the nanodisks.

As shown in FIG. 1c and FIG. 3b, the emitting color could be full color over all full-visible-spectrum. Referring to FIG. 5a and FIG. 5b, the light-emitting diode contains three T1 InGaN nanodisks, one T2 InGaN nanodisk, and one T3 InGaN nanodisk, and the growth temperatures for T1, T2, and T3 are $T_1>T_2>T_3$. In addition, a GaN barrier layer 7 is interposed between each two of the InGaN nanodisks 4. A white-light emission can be achieved by the above-mentioned structure.

The thickness of each nanodisk may range from 10 nm to 25 nm but it may smaller or greater than this range. The substrate 1 may be made of a material selected from a group consisted essentially of silicon carbide, semiconductor, plastic material, metal, glass, and combinations thereof. Besides, modifications, alternatives, equivalents, and variations for the embodiment of FIG. 5a and FIG. 5b are at least the same as the foregoing embodiments.

According to another embodiment of this invention, FIG. 6a to FIG. 6f illustrate a method to fabricate a vertical type of LED structure as shown in FIG. 5a.

Figure 6A:
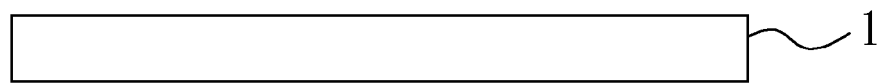
FIG. 6a to FIG. 6f show a method to fabricate the LED structure of FIG. 5 according to another embodiment of the present invention.

Referring to FIG. 6a, a substrate 1 is provided. The substrate 1 may include, but is not limited to, a silicon substrate, a silicon carbide (SiC) substrate, or other semiconductor substrates or other substrates made of other conducting materials. For illustrative purpose, a heavy doped n-type silicon(111) substrate 1 with resistivity 0.001-0.005 Ωcm is used. The substrate 1 may be cleaned by a normal procedure as known in the art. In addition, the substrate 1 may be dipped into a buffered oxide etching (BOE) solution, such as a hydrofluoric acid (HF) or ammonium fluoride (NH4F) aqueous solution, for removing native oxide layer on the surface of the substrate 1.

Figure 6B:

Referring to FIG. 6b, a first electrode 2, such as a Ti/Au electrode 2, is formed on the bottom surface of the substrate 1 by an evaporation method, such as thermal evaporation, electron-beam evaporation, sputtering, or other methods known in the art.

Figure 6C:
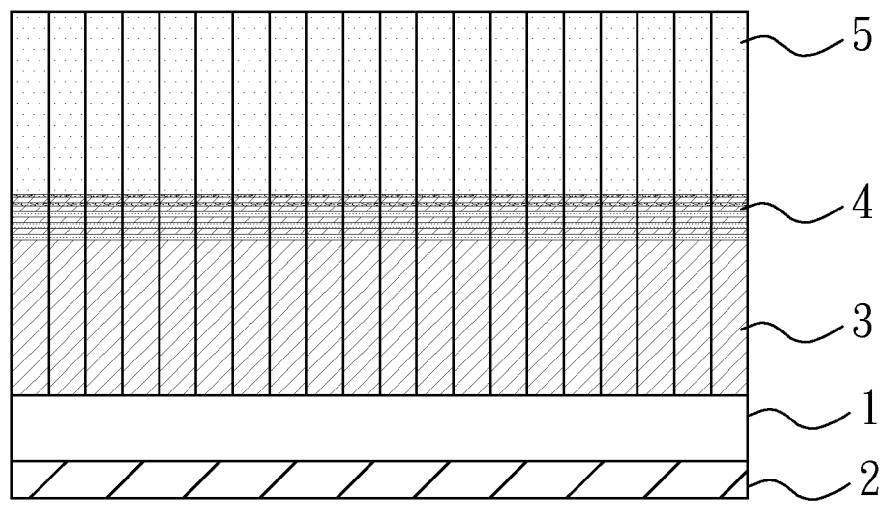

Referring to FIG. 6c, an electroluminescent (EL) structure at least including a first doped nanorod array 3, active light-emitting regions 4, and a second doped nanorod array 5 is formed by an epitaxial process, preferably the mentioned nitrogen-plasma-assisted molecular beam epitaxy (PAMBE). For illustrative purpose and preferably, the first doped nanorod array 3 is an n-type gallium nitride (GaN) nanorod array; each active light-emitting region 4 includes one or more indium gallium nitride (InGaN) nanodisks; and the second doped nanorod array 5 is a p-type gallium nitride (GaN) nanorod array.

The following illustrates a particular example to grow the electroluminescent (EL) structure. The PAMBE process is performed under nitrogen-rich conditions, in comparison to the group-III/nitrogen flux ratio used for III-nitride film growth. The nitrogen plasma source during the growth procedure is at a nitrogen gas flow rate of 3 sccm (standard cubic centimeter per minute) under 500 W RF forward power. The in-situ reflection high energy electron diffraction (RHEED) observation confirms that the grown nanorods are wurtzite-type single crystals, i.e., the nanorod axial growth direction is along the wurtzite c-axis. The in-plane crystallographic axes of the nanorods are found to be the following epitaxial relation: $<2\bar{1}\bar{1}0>\|[\bar{1}10]_{Si}$; $<1\bar{1}00>\|[11\bar{2}]_{Si}$. Prior to the InGaN nanodisk growth, Si-doped n-type GaN nanorod array with about 1 μm in height is grown first on the Si(111) substrate at a growth temperature 770° C. and a Ga beam equivalent pressure $(BEP_{Ga})$ $9\times10^{-8}$ Torr. Subsequently, InGaN nanodisks are grown on top of the n-type GaN nanorods. The emission wavelengths of InGaN nanodisks are controlled by the growth temperature (T) and group-III beam fluxes. In the exemplary example of FIG. 5a and FIG. 5b, three nanodisk growth temperature are $T_1>T_2>T_3$ ($T_1$: 705° C., $T_2$: 700° C., $T_3$: 690° C.). This structure is used for fabricating white LEDs and the growing conditions are: three $T_1$ nanodisks ($BEP_{Ga}$: $7.5\times10^{-8}$ Torr; $BEP_{In}$: $2.6\times10^{-8}$ Torr; thickness of InGaN/GaN: ~25 nm/25 nm), one $T_2$ nanodisk ($BEP_{Ga}$: $6.2\times10^{-8}$ Torr; $BEP_{Ga}$: $3.3\times10^{-8}$ Torr; thickness of InGaN/GaN: ~10 nm/25 nm), and one $T_3$ nanodisk ($BEP_{Ga}$: $5.7\times10^{-8}$ Torr; $BEP_{In}$: $3.7\times10^{-8}$ Torr; thickness of InGaN/GaN ~15 nm/25 nm). The thickness of each InGaN nanodisk may range from 10 nm to 25 nm and the GaN barrier thickness may be fixed at 25 nm, as shown schematically in FIG. 5a and FIG. 5b. On top of the $T_3$ InGaN nanodisk, Mg-doped p-type GaN nanorods with height about 1 μm are grown at 690° C. For growing structures of FIG. 5b, the Ga/N flux ratio may be gradually increased to induce lateral growth of n-type GaN nanorods and/or p-type GaN nanorods, thereby forming a quasi-continuous p-type GaN top film.

In addition, if necessary, a spin on glass (SOG) process may be performed to fill gaps between the nanorods. A liquid dielectric material or an oxide-based material may be used for this purpose.

Figure 6D:
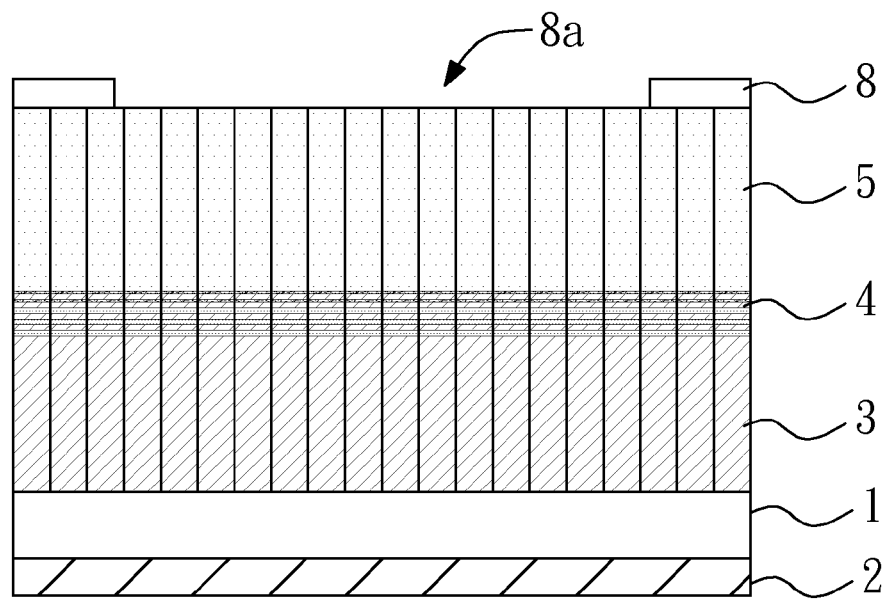

Referring to FIG. 6d, a patterned photoresist layer 8 with defined aperture 8a is formed on the second doped nanorod array 5. This step can be performed by methods known in the art, such as photolithography or E-beam lithography. For example, a photoresist layer is first coated on the second doped nanorod array 5, and then a pattern is transferred to the photoresist layer by illuminating with suitable light source, and thus aperture 8a is defined. Notice that other mask materials, such as anodic aluminum oxide (AAO) substrate, may replace the photoresist layer 8 for patterning.

Figure 6E:
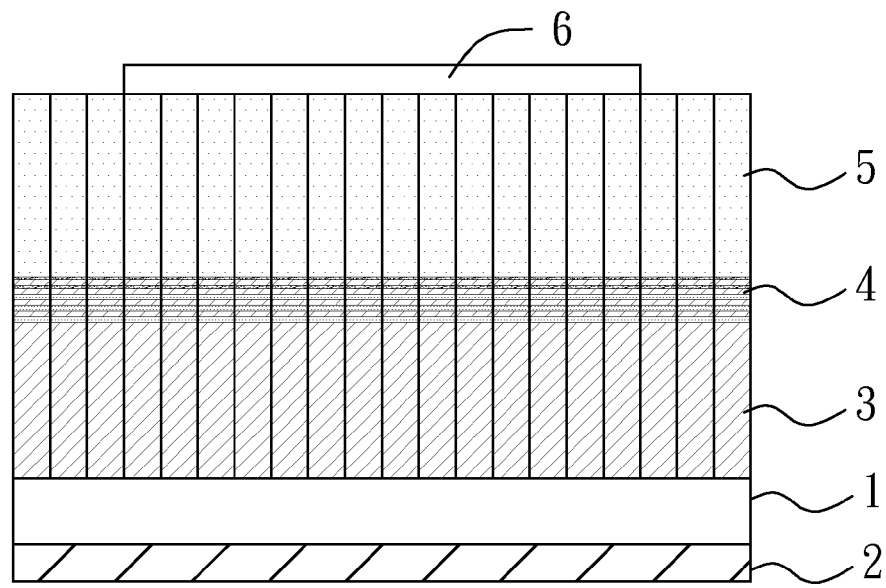

Referring to FIG. 6e, a second electrode 6 is then formed on the second doped nanorod array 5 within the aperture 8a by the mentioned evaporation method.

Figure 6F:
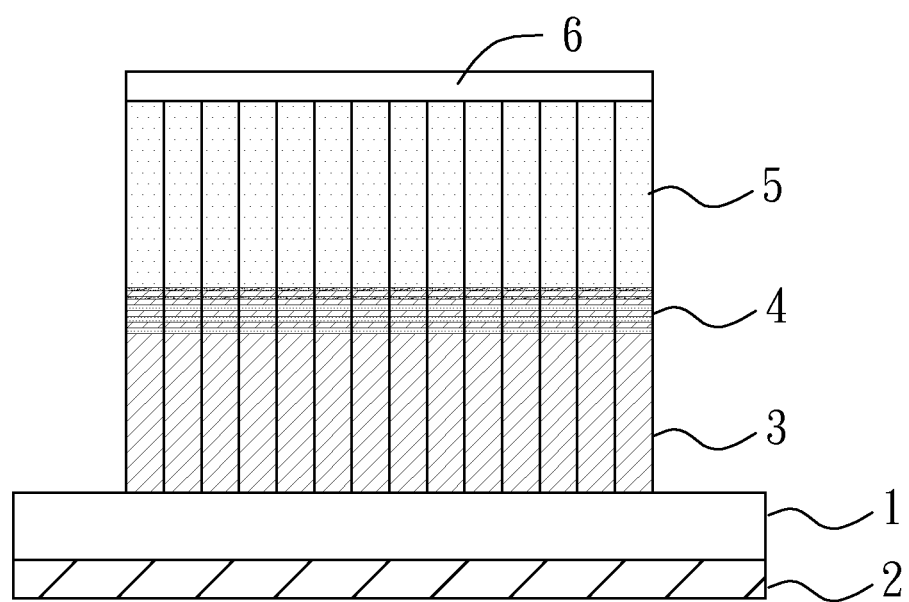

Referring to FIG. 6f, if necessary, another photoresist layer (not shown) may be formed on the second electrode 6, so as to remove unused nanorod array by a proper method, such as an etching method, preferably the inductively coupled plasma (ICP) etching method. Notice that this step may be omitted for saving cost.

The order of the method recited in FIG. 6a to FIG. 6f may be interchanged. For example, a mask may be used to define where the electroluminescent structure 3/4/5/7 is grown, so that the step of FIG. 6f can be omitted. For example, the first electrode 2 may be formed after the electroluminescent structure 3/4/5/7 is formed.

Although specific embodiments have been illustrated and described, it will be appreciated by those skilled in the art that various modifications may be made without departing from the scope of the present invention, which is intended to be limited solely by the appended claims.

What is claimed is:

1. A method for producing a light-emitting diode, comprising the steps of:
    providing a conductive substrate;
    forming a first electrode electrically contacting the conductive substrate;
    forming a n-type gallium nitride (GaN) nanorod array consisted of one or more n-type GaN nanorods that arranged on the substrate, forming electrical contact with the first electrode;
    forming one or more indium gallium nitride (InGaN) nanodisks on each of the n-type GaN nanorod;
    forming a p-type GaN nanorod array consisted of one or more p-type GaN nanorods, wherein one p-type GaN nanorod is corresponded to one n-type GaN nanorod and is formed on top of the one or more InGaN nanodisks of the corresponded n-type GaN nanorod; and
    forming a second electrode that electrically contacts with the p-type GaN nanorod array;
    wherein an emission color of the light-emitting diode is determined by the number and thickness of the one or more indium gallium nitride (InGaN) nanodisks and the light-emitting diode is capable of emitting white light without using phosphor.

2. The method as recited in claim 1, wherein the n-type or p-type gallium nitride (GaN) nanorods are wurtzite-type single crystals in which the axial growth direction of the nanorods is along the wurtzite c-axis.

3. The method as recited in claim 2, wherein the n-type gallium nitride (GaN) nanorod array, the indium gallium nitride (InGaN) nanodisks, and the p-type gallium nitride (GaN) nanorod array are formed by a nitrogen-plasma-assisted molecular beam epitaxy method.

4. The method as recited in claim 3, wherein the nitrogen-plasma-assisted molecular beam epitaxy (PAMBE) is performed under nitrogen-rich conditions in comparison to a group-III/nitrogen flux ratio used for an III-nitride film growth.

5. The method as recited in claim 3, wherein the one or more indium gallium nitride (InGaN) nanodisks comprises one or more $T_1$ InGaN nanodisks, one or more $T_2$ InGaN nanodisks, and one or more $T_3$ InGaN nanodisks, and the growth temperatures for $T_1$, $T_2$, and $T_3$ are $T_1 > T_2 > T_3$.

6. The method as recited in claim 5, wherein the combined electroluminescence from $T_1$, $T_2$, and $T_3$ InGaN nanodisks produces white light luminescence.

7. The method as recited in claim 1, if forming two or more InGaN nanodisks, a GaN barrier is further formed between each two of the InGaN nanodisks.

8. The method as recited in claim 1, wherein the conductive substrate comprises a silicon substrate or other conductive semiconductor substrates.

9. The method as recited in claim 1, wherein an electroluminescence from the one or more InGaN nanodisks is monochromatic or polychromatic.

10. The method as recited in claim 1, wherein an electroluminescence from the light-emitting diode is polarized.

11. The method as recited in claim 1, wherein each indium gallium nitride (InGaN) nanodisk has a thickness equal to or more than 10 nm.

12. The method as recited in claim 11, wherein each indium gallium nitride (InGaN) nanodisk has a thickness about 10 nm to 40 nm.

13. The method as recited in claim 1, wherein the electroluminescent wavelengths of the light-emitting diode are insensitive to an increase of an injection current.

14. The method as recited in claim 1, wherein a color temperature emitted from the light-emitting diode is independent on an injection current of the light-emitting diode.

15. The method as recited in claim 14, wherein the color temperature emitted from the light-emitting diode is maintained at about 6,000 K for injection currents larger than 5 mA.

16. The method as recited in claim 1, wherein a relative external quantum efficiency (EQE) is monotonously increased when the current density of injection currents is increased to above 50 A/cm$^2$.

17. The method as recited in claim 1, wherein each of the p-type GaN nanorods and/or the n-type GaN nanorods has two ends in which the first end from the second electrode is wider than the other.

18. The method as recited in claim 1, wherein the conductive substrate is made of a material selected from a group consisted essentially of silicon carbide, semiconductor, plastic material, metal, glass, and combinations thereof.

* * * * *